United States Patent [19]

Yatsuda et al.

[11] Patent Number: 5,175,519
[45] Date of Patent: Dec. 29, 1992

[54] SURFACE ELASTIC WAVE FILTER HAVING FINGER OMITTED TRANSDUCERS TO ELIMINATE SIDE LOBES

[75] Inventors: Hiromi Yatsuda; Yoshihiko Takeuchi, both of Mitaka, Japan

[73] Assignee: Nihon Musen Kabushiki Kaisha, Tokyo, Japan

[21] Appl. No.: 510,604

[22] Filed: Apr. 18, 1990

[30] Foreign Application Priority Data

Apr. 25, 1989 [JP] Japan .................. 1-106936

[51] Int. Cl.⁵ .................................. H03H 9/64
[52] U.S. Cl. .................. 333/194; 310/313 B; 310/313 C; 333/196
[58] Field of Search ............ 333/193–196, 333/150–154; 310/313 R, 313 B, 313 C, 313 D

[56] References Cited

U.S. PATENT DOCUMENTS

| 3,946,342 | 3/1976 | Hartmann | 333/196 |
| 4,321,567 | 3/1982 | Sandy | 333/194 X |
| 4,464,597 | 8/1989 | Setsune | 333/193 X |
| 4,491,758 | 1/1985 | Hartmann | 310/313 C |
| 4,492,940 | 1/1985 | Hikita | 333/194 |
| 4,600,852 | 7/1986 | Gerber | 310/313 C X |

FOREIGN PATENT DOCUMENTS

| 3304053 C2 | 9/1983 | Fed. Rep. of Germany . |
| 55-073123 | 6/1980 | Japan . |
| 149818 | 11/1981 | Japan | 333/194 |
| 33920 | 2/1984 | Japan | 333/194 |
| 252704 | 11/1986 | Japan | 333/193 |
| 55003281 | 1/1988 | Japan . |
| 253712 | 10/1988 | Japan | 333/193 |
| 63-304707 | 12/1988 | Japan . |
| 2193060 | 1/1988 | United Kingdom . |

OTHER PUBLICATIONS

"Soviet Journal of Communications Technology and Electronics", Scripta Technica Inc., vol. 32, Jan. 1987, pp. 159–160.

Primary Examiner—Eugene R. LaRoche
Assistant Examiner—Benny Lee
Attorney, Agent, or Firm—Frishauf, Holtz, Goodman & Woodward

[57] ABSTRACT

A surface elastic wave filter includes a plurality of input interdigital transducers for receiving a high-frequency input signal, and a plurality of output inter-digital transducers for producing an output signal derived from the input signal and having predetermined frequency characteristics. Each of the input and output interdigital transducers having a pair of confronting connectors for receiving the input signal and extracting the output signal, respectively, and a pair of groups of interdigitating electrode fingers extending from the connectors. The input and/or output interdigital transducers include finger-withdrawn interdigital transducers with electrode fingers selectively withdrawn in different positions. With such withdrawal weighting, the interdigital transducers have different sidelobe characteristics, i.e., frequency blocking characteristics, so that the surface elastic wave filter operates with a greater sidelobe suppression.

24 Claims, 10 Drawing Sheets (a)

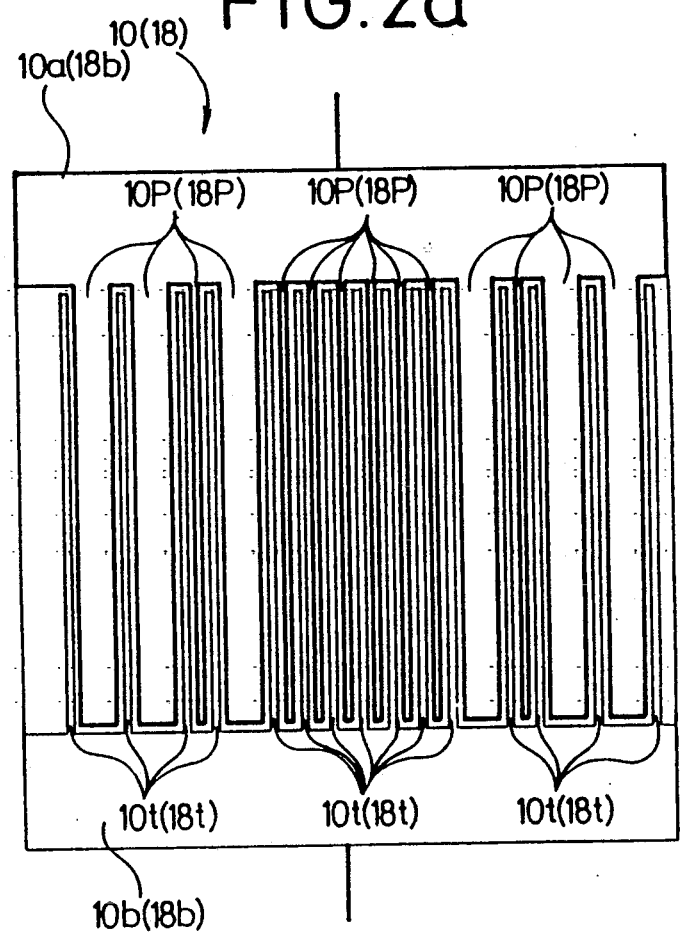

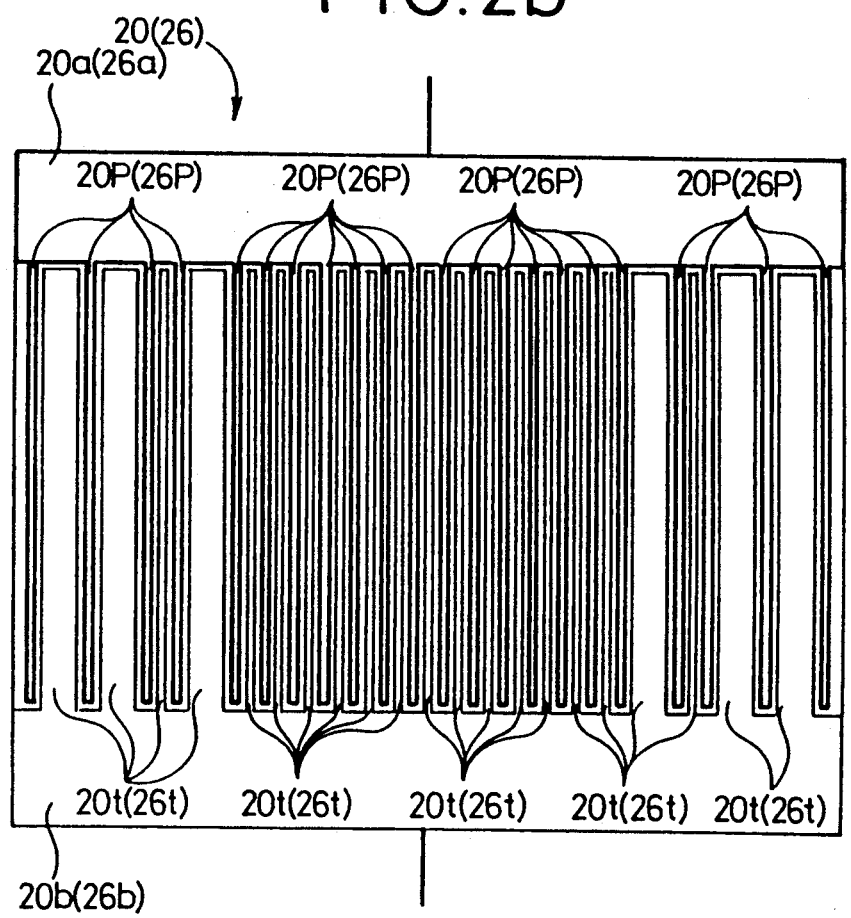

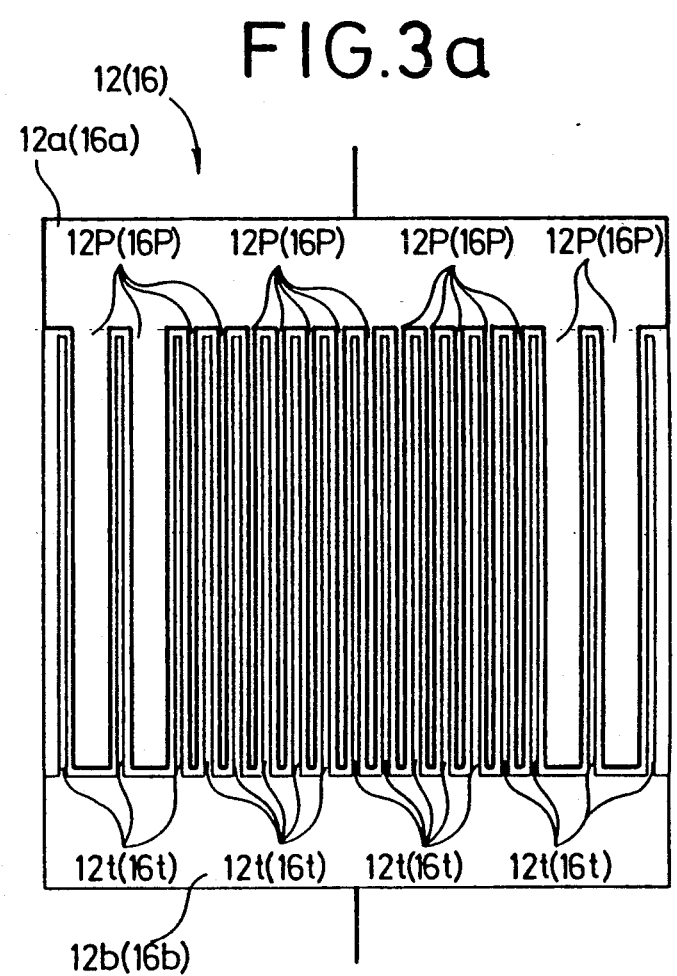

(a)

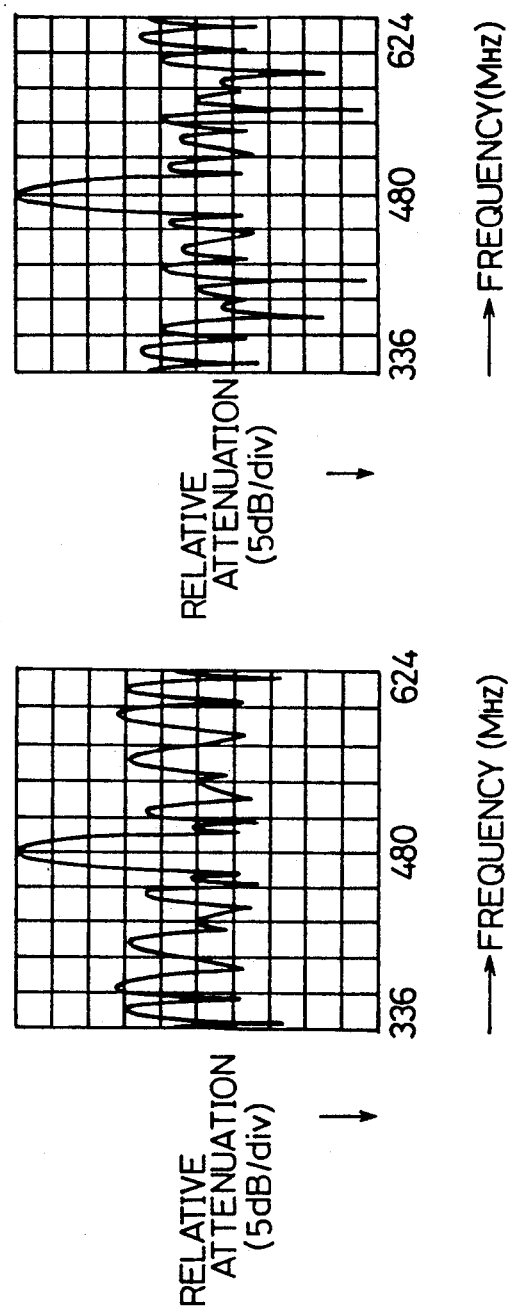

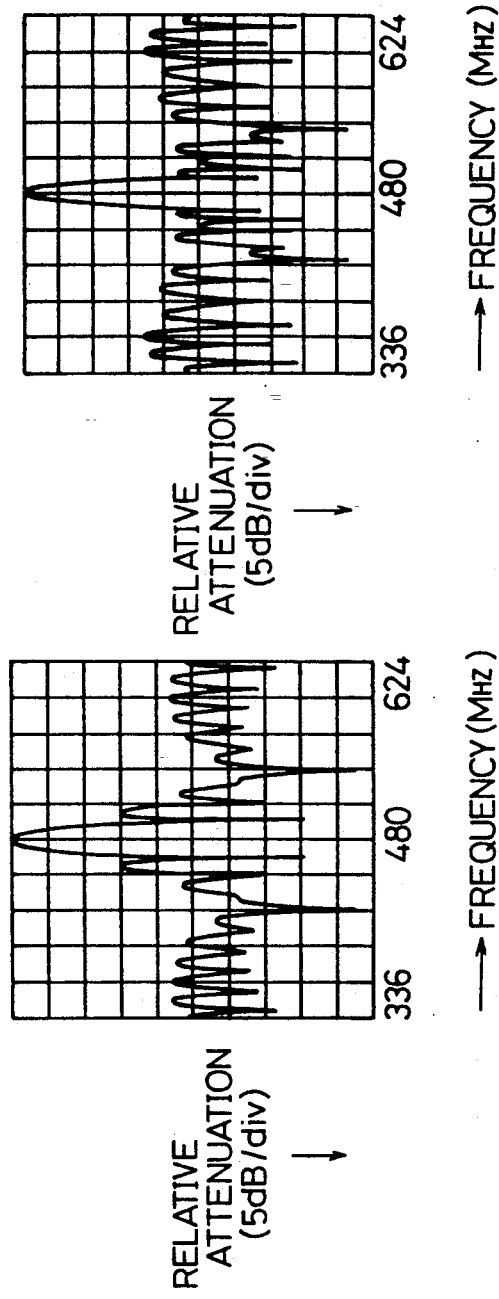

SURFACE ELASTIC WAVE FILTER HAVING FINGER OMITTED TRANSDUCERS TO ELIMINATE SIDE LOBES

BACKGROUND OF THE INVENTION

The present invention relates to a surface elastic wave filter having a plurality of input and output interdigital transducers which are alternately arranged, e.g., arranged such that the output interdigital transducers are disposed between the input interdigital transducers. More specifically, the present invention relates to a surface elastic wave filter having a plurality of input and output interdigital transducers, the input and/or output interdigital transducers comprising either finger-withdrawn interdigital transducers which have electrode fingers withdrawn in different positions and different frequency blocking ranges, so that the surface elastic wave filter has desired better frequency blocking ranges and a low insertion loss.

Known surface elastic wave filters with desired amplitude and phase characteristics designed substantially independently of each other include apodized interdigital transducers used as weighted transducers for one of input and output interdigital transducers. Such surface elastic wave filters are subject to ripples created in their passband due to the electric reexcitation effect. In order to reduce the ripples, the surface elastic wave filters are used with a relatively large insertion loss of 20 dB, for example.

One effective approach to improve the insertion loss, i.e., to lower the ripples and the insertion loss, is to employ a number of input and output interdigital transducers with the output interdigital transducers disposed between the input interdigital transducers. Since the output interdigital transducers are positioned between the input interdigital transducers, a surface wave produced from the input interdigital transducers by bidirectional excitation is applied to the output interdigital transducers. Reradiated waves owing to electric reexcitation and passed waves cancel each other, so that any reflective waves responsible for ripples in the passband will not be generated. The surface elastic wave filter which is designed through the above technical approach for a lower insertion loss is, however, unable to reach a desired large level of attenuation in the frequency blocking ranges because of increased electric reexcitation. To avoid such a drawback, the interdigital transducers employed in the surface elastic wave filters are weighted.

Since apodized interdigital transducers suffer a large weighting loss and electric reexcitation, finger-withdrawn interdigital transducers, i.e., interdigital transducers from which electrode fingers ar selectively withdrawn, are used as input and output interdigital transducers.

According to one conventional scheme, a surface elastic filter comprises a plurality of uniform input interdigital transducers having 58 interdigitating electrode fingers (i.e., 29 electrode finger pairs) and a plurality of finger-withdrawn interdigital transducers having 25 electrode pairs with selected electrode fingers withdrawn in the same positions. Actually, four such output interdigital transducers are disposed between five such input interdigital transducers. The five input interdigital transducer have respective signal input connectors and respective ground connectors which are connected parallel to each other and also to input terminals. Likewise, the four output interdigital transducers have respective signal output connectors and ground connectors which are connected parallel to each other and also to output terminals. In operation, a high-frequency signal is supplied to the input terminals, and a signal derived from the high-frequency signal and having frequency characteristics depending on the characteristics of the input and output interdigital transducers is extracted from the output terminals.

The above conventional surface elastic filter is weighted such that the five uniform input interdigital transducers and the four finger-withdrawn output interdigital transducers are alternately arranged. The prior weighted surface elastic filter is however disadvantageous in that high-level sidelobes are produced in the frequency blocking ranges and hence desired effective frequency blocking ranges cannot be achieved.

SUMMARY OF THE INVENTION

It is a primary object of the present invention to provide a surface elastic wave filter which has desired better frequency blocking ranges and an effectively reduced insertion loss.

Another object of the present invention is to provide a surface elastic wave filter comprising a plurality of input interdigital transducers for receiving a high-frequency input signal, and a plurality of output interdigital transducers for producing an output signal derived from the input signal and having predetermined frequency characteristics, each of the input and output interdigital transducers having a pair of confronting connectors for receiving the input signal and extracting the output signal, respectively, and a pair of groups of interdigitating electrode fingers extending from the connectors, the input interdigital transducers including at least two types of finger-withdrawn interdigital transducers with electrode fingers selectively withdrawn in different positions.

Still another object of the present invention is to provide the surface elastic wave filter wherein the input interdigital transducers comprise uniform interdigital transducer with equal numbers of electrode finger pairs and finger-withdrawn interdigital transducers with electrode fingers selectively withdrawn.

Yet another object of the present invention is to provide the surface elastic wave filter wherein the input interdigital transducers include a central interdigital transducer having a central line extending thereacross, the input interdigital transducers being symmetrically arranged with respect to the central line, and wherein the finger-withdrawn interdigital transducers have different numbers of withdrawn electrode fingers, and the finger-withdrawn interdigital transducer having more withdrawn electrode fingers than those of the finger-withdrawn interdigital transducer positioned closest to the central line is positioned farthest from the central line in a direction transverse to the central line.

Yet still another object of the present invention is to provide the surface elastic wave filter wherein the input interdigital transducers include a central interdigital transducer having a central line extending thereacross, the input interdigital transducers being symmetrically arranged with respect to the central line, and wherein the finger-withdrawn interdigital transducers have different numbers of withdrawn electrode fingers, the different numbers being successively incremented by 2 in a direction away from the central line.

A further object of the present invention is to provide a surface elastic wave filter comprising a plurality of input interdigital transducers for receiving a high-frequency input signal, and a plurality of output interdigital transducers for producing a output signal derived from the input signal and having predetermined frequency characteristics, each of the input and output interdigital transducers having a pair of confronting connectors for receiving the input signal and extracting the output signal, respectively, and a pair of groups of interdigitating electrode fingers extending from the connectors, the output interdigital transducers including at least two types of finger-withdrawn interdigital transducers with electrode fingers selectively withdrawn in different positions.

A still further object of the present invention is to provide the surface elastic wave filter wherein the output interdigital transducers comprise uniform interdigital transducers with equal numbers of electrode finger pairs and finger-withdrawn interdigital transducers with electrode fingers selectively withdrawn.

A yet further object of the present invention is to provide the surface elastic wave filter wherein the output interdigital transducers include a central interdigital transducer having a central line extending thereacross, the output interdigital transducers being symmetrically arranged with respect to the central line, and wherein he finger-withdrawn interdigital transducers have different numbers of withdrawn electrode fingers, and the finger-withdrawn interdigital transducer having more withdrawn electrode fingers than those of the finger-withdrawn interdigital transducer positioned closest to the central line is positioned farthest from the central line in a direction transverse to the central line.

A yet still further object of the present invention is to provide the surface elastic wave filter wherein the output interdigital transducers include a central interdigital transducer having a central line extending thereacross, the output interdigital transducers being symmetrically arranged with respect to the central line, and wherein the finger-withdrawn interdigital transducers have different numbers of withdrawn electrode fingers, the different numbers being successively incremented by 2 in a direction away from the central line.

Another object of the present invention is to provide a surface elastic wave filter comprising a plurality of input interdigital transducers for receiving a high-frequency input signal, and a plurality of output interdigital transducers for producing an output signal derived from the input signal and having predetermined frequency characteristics, each of the input and output interdigital transducers having a pair of confronting connectors for receiving the input signal and extracting the output signal, respectively, and a pair of groups of interdigitating electrode fingers extending from the connectors, the input interdigital transducers including at least two types of finger-withdrawn interdigital transducers with electrode fingers selectively withdrawn in different positions, the output interdigital transducers including at least two types of finger-withdrawn interdigital transducers with electrode fingers selectively withdrawn in different positions.

Still another object of the present invention is to provide the surface elastic wave filter wherein the input interdigital transducers comprise uniform interdigital transducers with equal numbers of electrode finger pairs and finger-withdrawn interdigital transducers with electrode fingers selectively withdrawn, and wherein the output interdigital transducers comprise uniform interdigital transducers with equal numbers of electrode finger pairs and finger-withdrawn interdigital transducers with electrode fingers selectively withdrawn.

Yet another object of the present invention is to provide the surface elastic wave filter wherein the input and output interdigital transducers include a central interdigital transducer having a central line extending thereacross, the input and output interdigital transducers being symmetrically arranged with respect to the central line, and wherein the finger-withdrawn interdigital transducers have different numbers of withdrawn electrode fingers, and the finger-withdrawn interdigital transducer having more withdrawn electrode fingers than those of the finger-withdrawn interdigital transducer positioned closest to the central line is positioned farthest from the central line in a direction transverse to the central line.

Yet still another object of the present invention is to provide the surface elastic wave filter wherein the input and output interdigital transducers include a central interdigital transducer having a central line extending thereacross, the input and output interdigital transducers being symmetrically arranged with respect to the central line, and wherein the finger-withdrawn interdigital transducers have different numbers of withdrawn electrode fingers, the different numbers being successively incremented by 2 in a direction away from the central line.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 1 is a schematic plan view of a surface elastic wave filter with a central input transducer according to the present invention;

FIGS. 2(a) and 2(b) are enlarged plan views of input and output interdigital transducers in the surface elastic wave filter shown in FIG. 1;

FIGS. 3(a) and 3(b) are enlarged plan views of other input and output interdigital transducers in the surface elastic wave filter shown in FIG. 1;

FIGS. 5(a) through 5(e) are diagrams showing frequency characteristics of the input and output interdigital transducers in the surface elastic wave filter illustrated in FIG. 1.

DETAILED DESCRIPTION OF THE PREFERRED EMBODIMENT

Figure 1A:
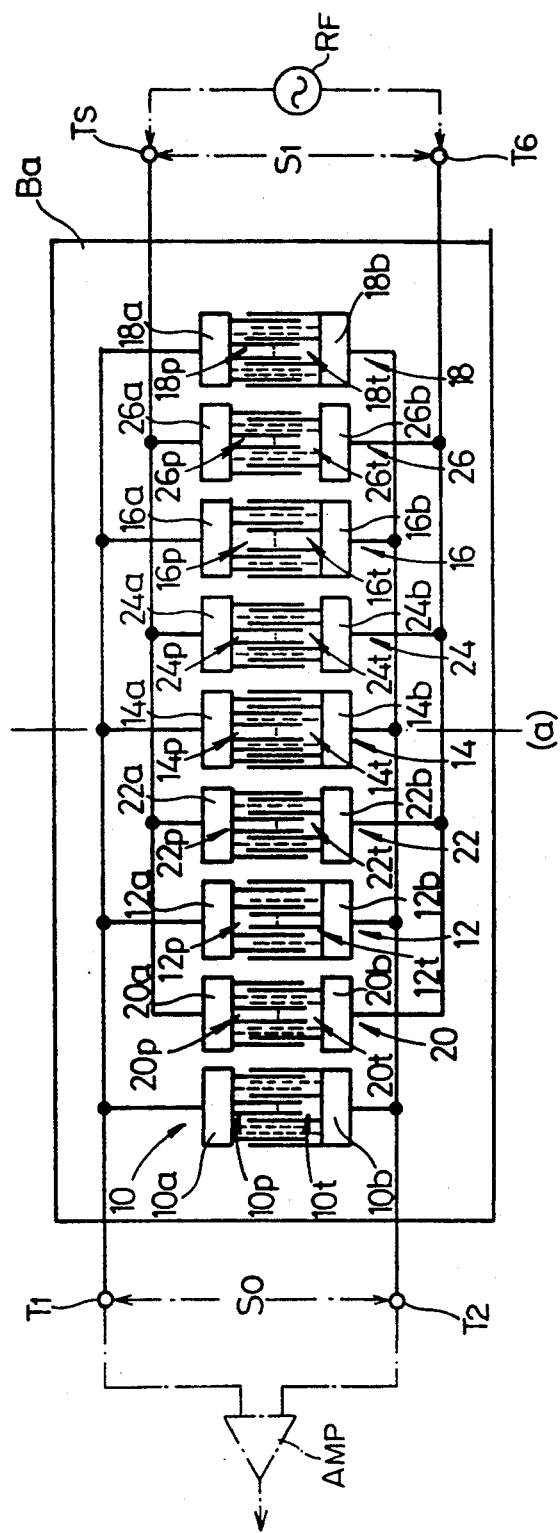
FIG. 1A is a schematic plan view of a surface elastic wave filter with a central output transducer according to the present invention.

FIG. 1 shows a surface elastic wave filter according to the present invention. The surface elastic wave filter comprises a piezoelectric substrate Ba made of a ceramic material or the like, a plurality of (e.g., five) input interdigital transducers 10, 12, 14, 16, 18 deposited on the piezoelectric substrate Ba by sputtering or the like, and a plurality of (e.g., four) output interdigital transducers 20, 22, 24, 26 deposited on the piezoelectric substrate Ba by sputtering or the like. The output interdigital transducers 20, 22, 24, 26 are positioned between the input interdigital transducers 10, 12, 14, 16, 18. The surface elastic wave filter also has input terminals T1, T2 connected to the input interdigital transducers 10, 12, 14, 16, 18, for receiving an input signal Si from a high-frequency signal source RF, and output terminals T5, T6 connected to the output interdigital transducers 20, 22, 24, 26, for receiving an output signal So from these output interdigital transducers. The output terminals T5, T6 are also coupled to input terminals of an amplifier AMP.

The input interdigital transducers 10, 12, 14, 16, 18 have respective signal input connectors 10a, 12a, 14a, 16a, 18a and respective ground connectors 10b, 12b, 14b, 16b, 18b which are disposed in confronting relation to each other. The input interdigital transducers 10, 12, 14, 16, 18 also include respective groups of parallel electrode fingers 10p, 12p, 14p, 16p, 18p extending from the signal input connectors 10a, 12a, 14a, 16a, 18a, respectively, and respective groups of parallel electrode fingers 10t, 12t, 14t, 16t, 18t extending from the ground connectors 10b, 12b, 14b, 16b, 18b, respectively. These electrode fingers are disposed in interdigitating relationship in each of the input interdigital transducers 10, 12, 14, 16, 18.

The output interdigital transducers 20, 22, 24, 26 have respective signal input connectors 20a, 22a, 24a, 26a and respective ground connectors 20b, 22b, 24b, 26b which are disposed in confronting relation to each other. The output interdigital transducers 20, 22, 24, 26 also include respective groups of parallel electrode fingers 20p, 22p, 24p, 26p extending from the signal input connectors 20a, 22a, 24a, 26a, respectively, and respective groups of parallel electrode fingers 20t, 22t, 24t, 26t extending from the ground connectors 20b, 22b, 24b, 26b, respectively. These electrode fingers are disposed in interdigitating relationship in each of the output interdigital transducers 20, 22, 24, 26.

FIG. 1A shows an embodiment wherein the structure of the filter is the same as shown in FIG. 1 except that in FIG. 1A, the input transducers are replaced with output transducers, the output transducers are replaced with input transducers, and the power sources $R_F$ and $A_{mp}$ are interchanged to properly feed the interchanged input and output transducers. The elastic wave filter shown in FIG. 1A will operate and function substantially in the manner described in connection with FIG. 1.

The input interdigital transducers 10, 12, 14, 16, 18 and the output interdigital transducers 20, 22, 24, 26 will be described in detail with reference to FIGS. 2(a), 2(b), 3(a), 3(b), and 4.

Only the input interdigital transducers 10, 12, 14 and the output interdigital transducers 20, 22 are illustrated in FIGS. 2(a), 2(b), 3(a), 3(b), and 4. The input interdigital transducers 16 and 18, which are not shown, are structurally identical to the input interdigital transducers 12 and 10 respectively, and these input interdigital transducers are symmetrically arranged with respect to a central transverse line (a) shown in FIG. 1. Similarly, the output interdigital transducers 24, 26, which are not shown, are structurally identical to the input interdigital transducers 22, 20, and these input interdigital transducers are symmetrically arranged with respect to the central transverse line (a).

Figure 3B:
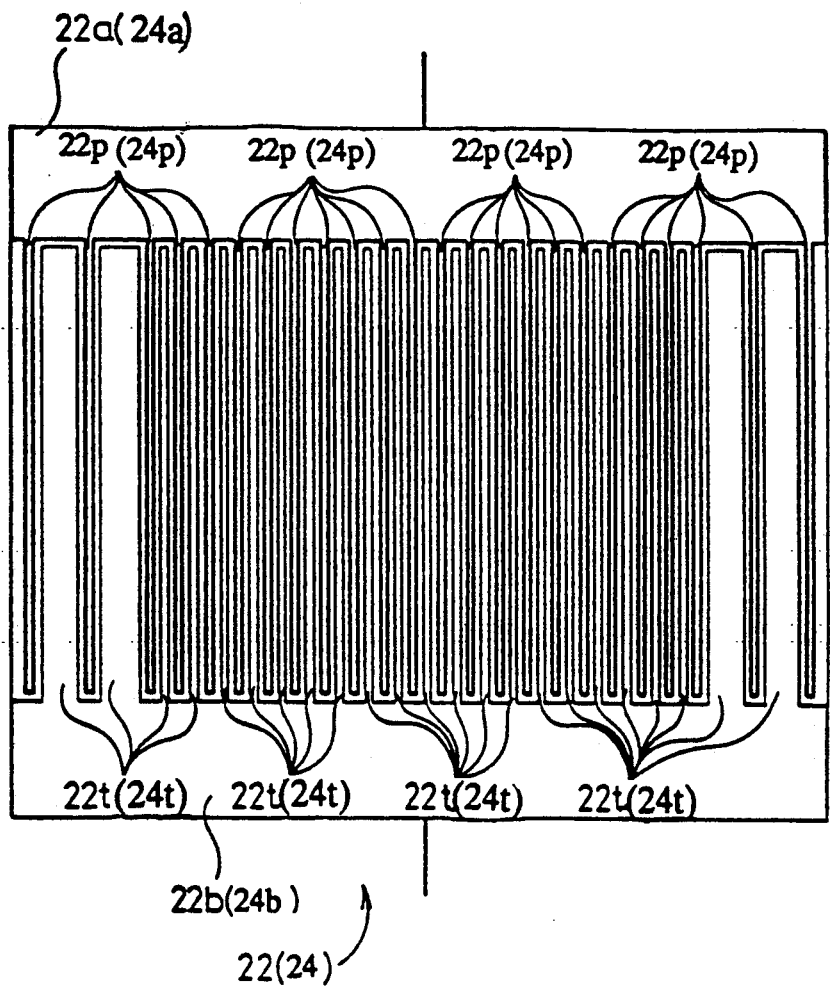
Figure 4:
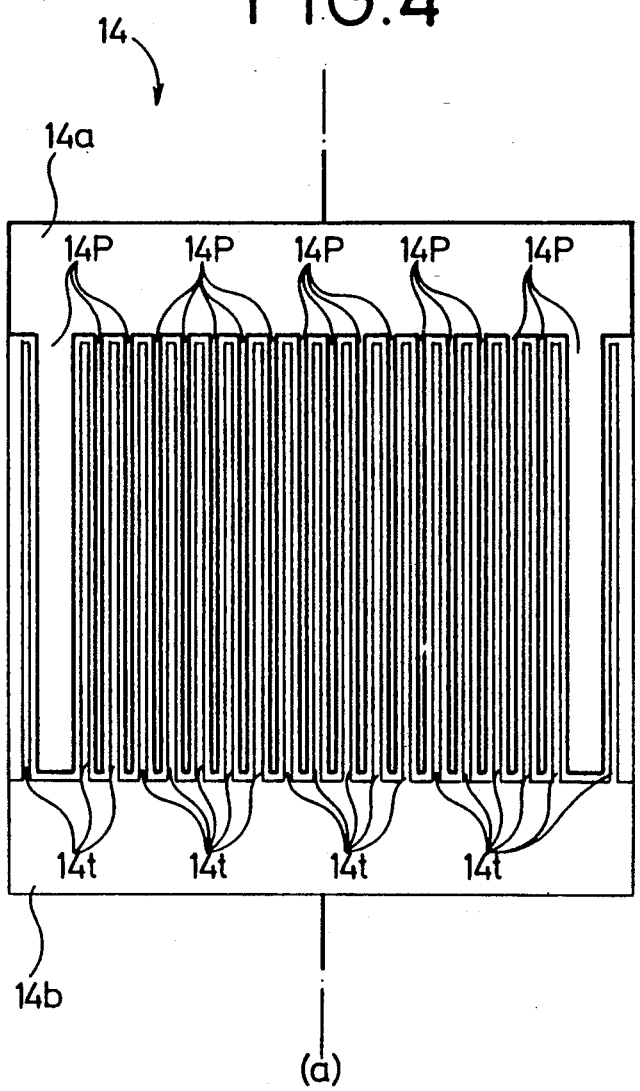
FIG. 4 is an enlarged plan view of another input interdigital transducer in the surface elastic wave filter shown in FIG. 1.

As shown in FIG. 2(a), the electrode fingers 10p, 10t (18p, 18t) of the input interdigital transducer 10 (18) are of a withdrawal weighting design such that six electrode fingers are withdrawn from each electrode finger group of a uniform interdigital transducer configuration with 25 electrode finger pairs. As shown in FIG. 3(a), the electrode fingers 12p, 12t (16p, 16t) of the input interdigital transducer 12 (16) are also selectively withdrawn such that four electrode fingers are withdrawn from each electrode finger group of a uniform interdigital transducer configuration with 25 electrode finger pairs, in positions different from the finger withdrawal positions in the input interdigital transducer 10 (18). As shown in FIG. 4, the electrode fingers 14p, 14t of the input interdigital transducer 14 are also selectively withdrawn such that two electrode fingers are withdrawn from each electrode finger group of a uniform interdigital transducer configuration with 25 electrode finger pairs, in positions different from the finger withdrawal positions in the input interdigital transducers 10 (18) and 12 (16) respectively.

As shown in FIG. 2(b), the electrode fingers 20p, 20t (26p, 26t) of the output interdigital transducer 20 (26) are of a withdrawal weighting design such that six electrode fingers are withdrawn from each electrode finger group of a uniform interdigital transducer configuration with 29 electrode finger pairs. As shown in FIG. 3(b), the electrode fingers 22p, 22t (24p, 24t) of the input interdigital transducer 22 (24) are also selectively withdrawn such that four electrode fingers are withdrawn from each electrode finger group of a uniform interdigital transducer configuration with 29 electrode finger pairs, in positions different from the finger withdrawal positions in the input interdigital transducer 22 (24).

Operation of the surface elastic wave filter thus constructed will be described below.

Figure 5E:
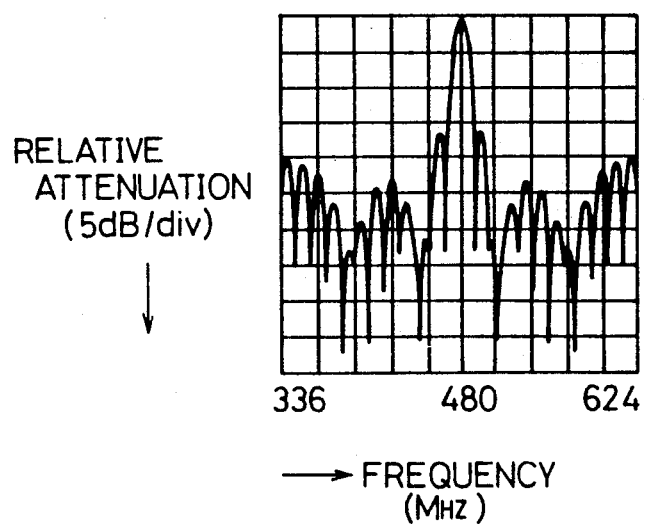

An input signal Si is applied from the high-frequency signal source RF to the input interdigital transducers 10, 12, 14, 16, 18. Since the input interdigital transducers 10 (18). 12 (16), 14 which are constructed according to the withdrawal-weighting method have different finger withdrawal positions, they have different sidelobes or frequency blocking ranges though their passbands and input impedances are essentially the same. The frequency characteristics of the input and output interdigital transducers are shown in FIGS. 5(a) through 5(e). FIG. 5(a) shows the frequency characteristics of the input interdigital transducers 10, 18, FIG. 5(b) shows the frequency characteristics of the input interdigital transducers 12, 16, and FIG. 5(c) shows the frequency characteristics of the input interdigital transducer 14. FIG. 5(d) illustrate the frequency characteristics of the output interdigital transducers 20, 26, and FIG. 5(e) illustrate the frequency characteristics of the output interdigital transducers 22, 24. In each of FIGS. 5(a) through 5(e), the vertical axis represents the level of relative attenuation, and the horizontal axis represents the frequency.

As shown in FIGS. 5(a) through 5(e), the finger-withdrawn input interdigital transducers 10, 18, the finger-withdrawn input interdigital transducers 12, 16, the finger-withdrawn input interdigital transducer 14, the finger-withdrawn output interdigital transducers 20, 26, and the finger-withdrawn output interdigital transducers 22, 24 have different sidelobes in their frequency blocking ranges though their passbands and input impedances are essentially the same, as described above. When output signals from the interdigital transducers which have such different frequency characteristics are combined through the parallel-connected interdigital transducers, the sidelobes of large levels are dispersed.

The input interdigital transducers 10, 12, 14, 16, 18 and the output interdigital transducers 20, 22, 24, 26 are of such a finger-withdrawn configuration that more electrode fingers are withdrawn from the interdigital transducers which are positioned more apart from the central input interdigital transducer 14. Operation of the surface elastic wave filter with such a withdrawal weighting design will be described below.

The overall loss of the surface elastic wave filter is determined by the amount of a surface wave energy which is dissipated outwardly from the input interdigital transducers 10, 18 that are farthest from the central input interdigital transducer 14. Therefore, the smaller the amount of a surface wave energy directed outwardly from the input interdigital transducers 10, 18, the smaller the loss of the surface elastic wave filter.

If each of the input interdigital transducers 10, 12, 14, 16, 18 and the output interdigital transducers 20, 22, 24, 26 had an equal number of electrode finger pairs, then the loss L (dB) of the surface elastic wave filter would be given by the following equation:

$$L = 10 \log (M+1)/(M-1)$$

where M is the total number of the input interdigital transducers 10, 12, 14, 16, 18 and the output interdigital transducers 20, 22, 24, 26.

As described above, more electrode fingers are withdrawn from the input and output interdigital transducers which are positioned more apart from the central input interdigital transducer 14. Consequently, the number of electrode finger pairs available for effective excitation becomes progressively greater toward the input interdigital transducer 14 and hence progressively smaller away from the input interdigital transducer 14. As a result, the surface wave energy becomes more intensive toward, and less intensive away from, the central input interdigital transducer 14. The loss is progressively lower away from the central input interdigital transducer 14, and the amount of a surface wave energy dissipated outwardly from the input interdigital transducers 10, 18 is lowered. Consequently, the total loss of the surface elastic wave filter is reduced.

Figure 6:
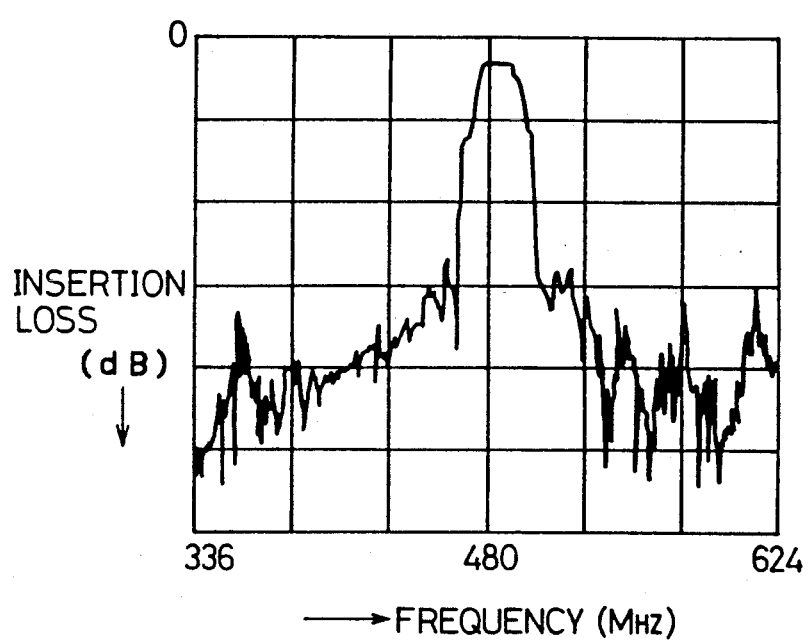
FIG. 6 is a diagram showing frequency characteristics of an output signal produced by the surface elastic wave filter shown in FIG. 1.

FIG. 6 shows the frequency characteristics of an output signal So produced from the output terminals T5, T6. In FIG. 6, the vertical axis indicates the insertion loss and the horizontal axis indicates the frequency. As indicated by the frequency characteristics of the output signal So shown in FIG. 6, periodic sidelobes in the frequency blocking ranges of the surface elastic wave filter are suppressed by 10 dB or more, for example, and hence the frequency blocking characteristics of the surface elastic filter are highly improved.

In the illustrated embodiment, all the input interdigital transducers 10, 12, 14, 16, 18 and the output interdigital transducers 20, 22, 24, 26 are in the form of finger-withdrawn interdigital transducers. However, the input and/or output interdigital transducers may comprise uniform interdigital transducers with no electrode fingers withdrawn and at least two different types of finger-withdrawn interdigital transducers. In such a modification, the number of electrode finger pairs or finger withdrawal positions of the input and output interdigital transducers should be selected so that the surface elastic wave filter has desired frequency blocking characteristics.

With the present invention, as described above, the surface elastic wave filter has a plurality of input interdigital transducers supplied with a high-frequency input signal and a plurality of output interdigital transducers for producing an output signal derived from the input signal and having desired frequency characteristics, the input and output interdigital transducers being alternately arranged. The input and output interdigital transducers have confronting connectors for receiving and extracting signals and electrode fingers extending from the connectors and disposed in interdigitating relationship. The input and/or output interdigital transducers include finger-withdrawn interdigital transducers with electrode fingers selectively withdrawn from a uniform interdigital transducer configuration. The finger-withdrawn interdigital transducers have some electrode fingers selectively withdrawn in different positions so that these interdigital transducers have different sidelobe characteristics, i.e., frequency blocking characteristics, though they have substantially the same passbands and input impedances. Output signals derived from the interdigital transducers having different frequency blocking characteristics are combined together, with the result that high-level sidelobes are dispersed.

As a consequence, the surface elastic wave filter has desired better frequency blocking ranges and an effectively reduced insertion loss.

Although a certain preferred embodiment has been shown and described, it should be understood that many changes and modifications may be made therein without departing from the scope of the appended claims.

What is claimed is:

1. A surface elastic wave filter which can substantially eliminate side lobes, comprising:
   a plurality of input interdigital transducers connected in parallel to each other and disposed on a substrate for receiving in parallel a high-frequency input signal and in response to said high frequency input signal generating a surface elastic wave to be propagated along said substrate;
   a plurality of output interdigital transducers connected in parallel to each other and disposed on said substrate for respectively producing respective output signals derived from the surface elastic wave generated in response to said input signal, said respective output signals when combined having predetermined frequency characteristics;
   each of said plurality of input interdigital transducers and each of said plurality of output interdigital transducers comprising a pair of spaced apart connectors disposed on said substrate and facing each other, each connector having a plurality of spaced apart electrode fingers extending therefrom, at predetermined positions so that the electrode fingers from each respective pair of connectors are arranged in an interdigitated configuration; and
   said plurality of output interdigital transducers including a plurality of finger-omitted output interdigital transducers with electrode fingers omitted therefrom at preselected ones of said predetermined positions, said preselected ones of said predetermined positions being different in at least two of said finger-omitted output interdigital transducers.

2. A surface elastic wave filter according to claim 1, wherein said plurality of output interdigital transducers includes at least two output interdigital transducers each having an equal number of electrode fingers without any electrode fingers being omitted therefrom.

3. A surface elastic wave filter according to claim 2, wherein:
said plurality of output interdigital transducers includes an output central interdigital transducer;
remaining ones of said output interdigital transducers other than said output central interdigital transducers being disposed on said substrate with respect to said central interdigital transducer, such that said plurality of output interdigital transducers are disposed in a row symmetrically about the output central interdigital transducer;
said plurality of finger-omitted output interdigital transducers comprises finger-omitted output interdigital transducers having different numbers of electrode fingers omitted therefrom; and
ones of said finger-omitted interdigital transducers which are positioned farther from the output central interdigital transducer having a greater number of omitted electrode fingers than other ones of said output finger-omitted interdigital transducers which are positioned closer to said central interdigital transducer.

4. A surface elastic wave filter according to claim 2, wherein:
said plurality of output interdigital transducers includes an output central interdigital transducer;
remaining ones of said plurality of output interdigital transducers other than the output central interdigital transducer being symmetrically positioned on said substrate with respect to said central interdigital transducer, such that said plurality of output interdigital transducers are positioned in a row symmetrically about said output central interdigital transducers; and
said plurality of finger-omitted output interdigital transducers comprises finger-omitted interdigital transducers having different numbers of electrode fingers omitted therefrom, said different numbers of electrode fingers omitted successively being incremented by 2 for each successive one of said finger-omitted output interdigital transducers in the row in a direction away from said output central interdigital transducer.

5. A surface elastic wave filter according to claim 1, wherein the plurality of input interdigital transducer and the plurality of output interdigital transducers are each disposed on said substrate such that adjacent input interdigital transducers sandwich respective ones of said plurality of output interdigital transducers therebetween and adjacent output interdigital transducers sandwich respective ones of said plurality of input interdigital transducers therebetween.

6. A surface elastic wave filter according to claim 1, wherein:
said plurality of output interdigital transducers includes an output central interdigital transducer;
remaining ones of said plurality of output interdigital transducers other than said output central interdigital transducer being symmetrically disposed on said substrate with respect said central interdigital transducer, such that said plurality of output interdigital transducers are positioned in a row symmetrically about the output central interdigital transducer; and
said plurality of finger-omitted output interdigital transducers comprises finger-omitted interdigital transducers having different numbers of electrode fingers omitted therefrom, said different numbers of electrode fingers omitted successively incremented by 2 for for each successive one of said finger-omitted output interdigital transducers in a row in a direction away from the output central interdigital transducer.

7. A surface elastic wave filter according to claim 1, wherein:
said plurality of output interdigital transducers includes an output central interdigital transducer;
remaining ones of said plurality of output interdigital transducers other than the central interdigital transducer being disposed on said substrate with respect to said central interdigital transducer, such that said plurality of output interdigital transducers are disposed in a row symmetrically about said output central interdigital transducers;
said plurality of finger-omitted output interdigital transducers comprises finger-omitted output interdigital transducers having different numbers of electrode fingers omitted therefrom; and
ones of said finger-omitted interdigital transducers which are positioned farther from the output central interdigital transducer having a greater number of omitted electrode finger then other ones of said output finger-omitted interdigital transducers which are positioned closer to said output central interdigital transducer.

8. A surface elastic wave filter according to claim 1, wherein said filter comprises at least two input interdigital transducers and at least two output interdigital transducers.

9. A surface elastic wave filter which can substantially eliminate side lobes, comprising:
a plurality of input interdigital transducers connected in parallel to each other and disposed on a substrate for receiving in parallel a high-frequency input signal and in response to said high frequency input signal generating a surface elastic wave to be propagated along said substrate;
a plurality of output interdigital transducers connected in parallel to each other and disposed on said substrate for respectively producing respective output signals derived from the surface elastic wave generated in response to said input signal, said respective output signals when combined having predetermined frequency characteristics;
each of said plurality of input interdigital transducers and each of said plurality of output interdigital transducers comprising a pair of spaced apart connectors disposed on said substrate and facing each other, each connector having a plurality of spaced apart electrode fingers extending therefrom at predetermined positions, so that the electrode fingers from each respective pair of connectors are arranged in an interdigitated configuration;
said plurality of input interdigital transducers including a plurality of finger-omitted input interdigital transducers with electrode fingers omitted therefrom at preselected ones of said predetermined positions, said preselected ones of said predetermined positions being different in at least two of said finger-omitted input interdigital transducers; and said plurality of output interdigital transducers including a plurality of finger-omitted output interdigital transducers with electrode fingers omitted therefrom at preselected ones of said predetermined positions, said preselected ones of said predetermined positions being different in at least two of said finger-omitted output interdigital transducers.

10. A surface elastic wave filter according to claim 9, wherein:

said plurality of input interdigital transducers further includes at least two input interdigital transducers each having an equal number of interdigital electrode fingers without any electrode fingers being omitted therefrom; and said plurality of output interdigital transducers includes at least two interdigital transducers each having an equal number of interdigital electrode fingers without any electrode fingers omitted therefrom.

11. A surface elastic wave filter according to claim 10, further comprising:

a central interdigital transducer included in one of said plurality of input interdigital transducers and said plurality of output interdigital transducer;

remaining ones of said plurality of input interdigital transducers and said plurality of output interdigital transducers other than said included central interdigital transducer being respectively disposed on said substrate with respect to said included central interdigital transducer, such that respective pairs of said plurality of input interdigital transducers and respective pairs of said plurality of output interdigital transducer are disposed in a row such that the transducers of each respective pair are symmetrically positioned about said included central interdigital transducer;

said plurality of finger-omitted input interdigital transducers and said plurality of finger-omitted output interdigital transducers respectively comprise:

finger-omitted interdigital transducers having different numbers of electrode fingers omitted therefrom; and ones of said finger-omitted interdigital transducers which are positioned farther from said central interdigital electrode having a greater number of omitted electrode fingers than other ones of said finger-omitted interdigital transducers which are positioned closer to said included central interdigital transducer.

12. A surface elastic wave filter according to claim 10, further comprising:

a central interdigital transducer included in one of said plurality of input interdigital transducers and said plurality of output interdigital transducers;

respective ones of said plurality of input interdigital transducers and said plurality of output interdigital transducers other than said included central interdigital transducer being disposed on said substrate with respect to said central interdigital transducer, such that respective pairs of said plurality of input interdigital transducers and respective pairs of said plurality of output interdigital transducers are disposed in a row such that the transducers of each respective pair are symmetrically positioned about said included central interdigital transducer;

said plurality of finger-omitted input interdigital transducers and said plurality of finger-omitted output interdigital transducers respectively comprise:

finger-omitted interdigital transducers having different numbers of electrode fingers omitted therefrom;

said different numbers of electrode fingers omitted successively being incremented by 2 for each successive one of said finger-omitted interdigital transducers in the row in a direction away from said central interdigital transducer.

13. A surface elastic wave filter according to claim 9, wherein the plurality of input and the plurality of output transducers are respectively disposed on said substrate such that adjacent input transducers sandwich respective ones of said plurality of output transducers therebetween, and adjacent output transducers sandwich one of said plurality of input transducers therebetween.

14. A surface elastic wave filter according to claim 9, further comprising:

a central interdigital transducer included in one of said plurality of input interdigital transducer and said plurality of output interdigital transducers;

respective ones of said plurality of input interdigital transducers and said plurality of output interdigital transducers other than said central interdigital transducers being disposed on said substrate with respect to said include central interdigital transducer, such that respective pairs of said plurality of input interdigital transducers and respective pairs of said plurality of output interdigital transducers are disposed in a row such that the transducers of each respective pair are symmetrically positioned about said included central interdigital transducer;

said plurality of finger-omitted input interdigital transducers and said plurality of finger-omitted output interdigital transducers respectively comprise:

finger-omitted interdigital transducers having different numbers of electrode fingers omitted therefrom;

said different numbers of electrode fingers omitted successively being incremented by 2 for each successive one of said finger-omitted interdigital transducers in the row in a direction away from said central interdigital transducer.

15. A surface elastic wave filter according to claim 9, further comprising:

a central interdigital transducer included in one of said plurality of input interdigital transducer and said plurality of output interdigital transducers;

the remaining ones of said plurality of input interdigital transducers and said plurality of output interdigital transducers other than said included central interdigital transducer being respectively disposed on said substrate with respect to said included central interdigital transducer, such that respective pairs of said plurality of output interdigital transducers are disposed in a row such that the transducers of each respective pair are symmetrically positioned about the included central interdigital transducer;

said plurality of finger-omitted input interdigital transducers and said plurality of finger-omitted output interdigital transducers respectively comprise:
- finger-omitted interdigital transducers having different numbers of electrode fingers omitted therefrom;
- ones of said finger-omitted interdigital transducers which are positioned farther from said central interdigital transducer having a greater number of omitted electrode fingers than other ones of said finger-omitted interdigital transducers which are positioned closer to said included central interdigital electrode.

16. A surface elastic wave filter according to claim 9, wherein said filter comprises at least two input interdigital transducers and at least two output interdigital transducers.

17. A surface elastic wave filter which can substantially eliminate side lobes, comprising:
- a plurality of input interdigital transducers connected in parallel to each other and disposed on a substrate for receiving in parallel a high-frequency input signal and in response to said high frequency input signal generating a surface elastic wave to be propagated along said substrate;
- a plurality of output interdigital transducers connected in parallel to each other and disposed on said substrate for respectively producing respective output signals derived from the surface elastic wave generated in response to said input signal, said respective output signals when combined having predetermined frequency characteristics;
- each of said plurality of input interdigital transducers and each of said plurality of output interdigital transducers comprising a pair of spaced apart connectors disposed on said substrate and facing each other, each connector having a plurality of spaced apart electrode fingers extending therefrom at predetermined positions, so that the electrode fingers from each respective pair of connectors are arranged in an interdigitated configuration; and
- said plurality of output interdigital transducers including a plurality of finger-omitted output interdigital with electrode fingers omitted therefrom at preselected ones of said predetermined positions, said preselected ones of said predetermined positions being different in at least two of said finger-omitted interdigital transducers.

18. A surface elastic wave filter according to claim 17, wherein:
- said plurality of input interdigital transducers includes an input central interdigital transducer;
- remaining ones of said plurality of input interdigital transducers other than the output central interdigital transducer being disposed on said substrate with respect to said central interdigital transducer, such that said plurality of input interdigital transducers are positioned in a row symmetrically about said input central interdigital transducer; and
- said plurality of finger-omitted input interdigital transducers comprises finger-omitted interdigital transducers having different numbers of electrode fingers omitted therefrom, said different numbers of electrode fingers omitted successively being incremented by 2 for each successive one of said finger-omitted input interdigital transducers in the row in a direction away from said central interdigital transducer.

19. A surface elastic wave filter according to claim 17, wherein the plurality of input interdigital transducers and the plurality of output interdigital transducers are each disposed on said substrate such that adjacent input interdigital transducers sandwich respective ones of said plurality of output interdigital transducers therebetween, and adjacent output interdigital transducers sandwich respective ones of said plurality of input interdigital transducers therebetween.

20. A surface elastic wave filter according to claim 17, wherein said filter comprises at least two input interdigital transducers and at least two output interdigital transducers.

21. A surface elastic wave filter according to claim 17, wherein:
- said plurality of input interdigital transducers includes an input central interdigital transducer;
- remaining ones of said plurality of input interdigital transducers other than the input central interdigital transducer being disposed on said substrate with respect to said central interdigital transducer, such that said plurality of interdigital transducers are disposed on said substrate in a row symmetrically about the input central interdigital transducer;
- said plurality of finger-omitted input interdigital transducers comprises finger-omitted input interdigital transducers having different numbers of electrode fingers omitted therefrom; and
- ones of said input finger-omitted interdigital transducers which are positioned farther from said central interdigital transducer having a greater number of omitted electrode fingers than other ones of said input finger-omitted interdigital transducers which are positioned closer to said central interdigital electrode.

22. A surface elastic wave filter according to claim 17, wherein said plurality of input interdigital transducers includes at least two input interdigital transducers each having an equal number of interdigital electrode fingers without any electrode fingers being omitted therefrom.

23. A surface elastic wave filter according to claim 22, wherein:
- said plurality of input interdigital transducers includes an input central interdigital transducer;
- remaining ones of said plurality of input interdigital transducers other than the input central interdigital transducer being disposed on said substrate with respect to said central interdigital transducer, such that said plurality of input interdigital transducers are positioned in a row symmetrically about the input central interdigital transducer; and
- said plurality of finger-omitted input interdigital transducers comprises finger-omitted interdigital transducers having different numbers of electrode fingers omitted therefrom, said different numbers of electrode fingers omitted successively being incremented by 2 for each successive one of said finger-omitted input interdigital transducers in the row in a direction away from said input central interdigital transducer.

24. A surface elastic wave filter according to claim 22, wherein:
- said plurality of input interdigital transducers includes an input central interdigital transducer;
- remaining ones of said plurality of input interdigital transducers other than the input central interdigital transducer being disposed on said substrate with respect to said central interdigital transducer, such that said plurality of input interdigital transducers are disposed on said substrate in a row symmetrically about the input central interdigital transducer;

said plurality of finger-omitted input interdigital transducers comprises finger-omitted input interdigital transducers having different numbers of electrode fingers omitted therefrom; and ones of said input finger-omitted interdigital transducers which are positioned farther from said central interdigital transducer having a greater number of omitted electrode fingers than other ones of said input finger-omitted interdigital transducers which are positioned closer to said central interdigital transducer.

* * * * *

UNITED STATES PATENT AND TRADEMARK OFFICE
CERTIFICATE OF CORRECTION

PATENT NO. : 5,175,519
DATED : December 29, 1992
INVENTOR(S) : Yatsuda, et. al.

It is certified that error appears in the above-indentified patent and that said Letters Patent is hereby corrected as shown below:

```
Column 9, line 65 (claim 6), delete "symmetrically";

line 66 (claim 6), after "respect" insert --to--;

Column 12, lines 20 and 21 (claim 13),

"sandwich one" should be --sandwich respective ones--
```

Signed and Sealed this

Fourth Day of June, 1996

Attest:

BRUCE LEHMAN

Attesting Officer

Commissioner of Patents and Trademarks